United States Patent
Yan

(10) Patent No.: US 7,682,951 B2
(45) Date of Patent: Mar. 23, 2010

(54) METHOD FOR FABRICATING A POLYSILICON LAYER HAVING LARGE AND UNIFORM GRAINS

(75) Inventor: Shuo-Ting Yan, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 322 days.

(21) Appl. No.: 11/978,328

(22) Filed: Oct. 29, 2007

(65) Prior Publication Data
US 2008/0102611 A1    May 1, 2008

(30) Foreign Application Priority Data
Oct. 27, 2006    (TW) .............................. 95139823 A

(51) Int. Cl.
*H01L 21/20* (2006.01)
(52) U.S. Cl. ................................. 438/487; 257/E21.09
(58) Field of Classification Search .................. None
See application file for complete search history.

(56) References Cited
U.S. PATENT DOCUMENTS
6,235,614 B1 * 5/2001 Yang ........................... 438/486
6,509,204 B2 * 1/2003 Campbell ..................... 438/97
2005/0106841 A1   5/2005 I-Chang
2005/0141580 A1 * 6/2005 Partlo et al. ................... 372/55

* cited by examiner

*Primary Examiner*—Evan Pert
*Assistant Examiner*—Andres Munoz
(74) *Attorney, Agent, or Firm*—Wei Te Chung

(57) ABSTRACT

An exemplary method for fabricating a polysilicon layer includes the following steps. A substrate (10) is provided and an amorphous silicon layer (12) is formed over the substrate. An excimer laser generator (13) for generating a pulse excimer laser beams collectively having the shape of a generally rectangular shaft is provided to melt a first area (15) of the amorphous silicon layer with the pulse excimer laser beams. The excimer laser generator is moved a distance to melt a second area of the amorphous layer spaced a short distance away from the first area. At least a subsequent third melted area spaced a short distance away from the second melted area is formed, with each subsequent melted area is spaced as short distance away from the immediately preceding melted area.

17 Claims, 2 Drawing Sheets

METHOD FOR FABRICATING A POLYSILICON LAYER HAVING LARGE AND UNIFORM GRAINS

FIELD OF THE INVENTION

The present invention relates to methods for fabricating polysilicon layers, and particularly to a method for fabricating a polysilicon layer having large and uniform grains.

BACKGROUND

At present, liquid crystal displays (LCDs) are the most common type of displays used in products such as notebook computers, game centers, and the like.

The principal driving devices for an LCD are thin film transistors (TFTs). Because the amorphous silicon layer in amorphous silicon TFTs can be made at a relatively low temperature (between 200° C. and 300° C.), amorphous silicon TFTs are frequently used in LCDs. However, the electron mobility of amorphous silicon is lower than 1 $cm^2/V.S.$ (one square centimeter per volt second). Hence, amorphous silicon TFTs cannot provide the speeds required of an LCD in certain high-speed devices. On the other hand, the polycrystalline silicon (or polysilicon) TFT has electron mobility as high as 200 $cm^2/V.S.$ Therefore polysilicon TFTs are more suitable for high-speed operations. However, the process of transforming an amorphous silicon layer into a polysilicon layer often requires an annealing temperature in excess of 600° C. Under that temperature, the glass substrate supporting the TFTs is liable to be distorted. Thus, a number of methods of fabricating a polysilicon layer at a reduced temperature have been developed. Among such methods, the excimer laser annealing (ELA) method is the most prominent.

In a typical ELA process of fabricating a polysilicon layer, an excimer laser generator generates a cylindroid (cylinder-like) excimer laser beam. The laser beam irradiates an amorphous silicon layer, moving up and down to melt a first area of the amorphous silicon layer. Then the excimer laser generator is stepped a distance, and moves up and down to melt a second area of the amorphous silicon layer that partially overlaps the first area of the melted amorphous silicon layer. Because the temperature of the overlapping portion of the second area is higher than the temperature of the non-overlapping portion of the second area, a lateral temperature gradient exists along the direction from the higher temperature to the lower temperature. Hence, heterogeneous nucleation occurs at the interface of the overlapping portion and the non-overlapping portion to form a few seeds of crystallization. Thereafter, the melted silicon starts crystallizing from the seeds of crystallization to finally form a polysilicon layer. Because the temperature of the ELA process is under 500° C., the polysilicon thin film transistors fabricated using such low temperature process are often called low temperature polysilicon thin film transistors (LTPS-TFTs).

However, in order to melt each area of the amorphous silicon layer, the laser generator has to move up and down several times. This contributes to the duration of the production cycle. Moreover, the size of polysilicon grains of the amorphous silicon layer has a positive correlation to a value of the lateral temperature gradient when the energy of the amorphous silicon layer is under the super lateral growth (SLG) point. In the aforementioned ELA process, the lateral temperature gradient has a relatively low value. Therefore the sizes of the fabricated polysilicon grains are small, and the polysilicon layer has relatively low electron mobility. Furthermore, it is hard to control the energy provided to the amorphous silicon layer. If the energy exceeds the SLG point, a density distribution of the seeds of crystallization may drop to a very low value within a transient interval. The sudden loss of seeds of crystallization may lead to the production of numerous small and highly non-uniform grains. Overall, the typical ELA method of fabricating a polysilicon layer is liable to have low efficiency, and the polysilicon layer fabricated by such method may have relatively low electron mobility.

Accordingly, what is needed is a method for fabricating a polysilicon layer that can overcome the above-described deficiencies.

SUMMARY

In one preferred embodiment, a method for fabricating a polysilicon layer includes the following steps. A substrate is provided and an amorphous silicon layer is formed over the substrate. An excimer laser generator for generating a pulse excimer laser beams collectively having the shape of a generally rectangular shaft is provided to melt a first area of the amorphous silicon layer with the pulse excimer laser beams. The excimer laser generator is moved a distance to melt a second area of the amorphous layer spaced a short distance away from the first area. At least a subsequent third melted area spaced a short distance away from the second melted area is formed, with each subsequent melted area is spaced as short distance away from the immediately preceding melted area.

In an alternative embodiment, a method for fabricating a polysilicon layer includes the following steps. A substrate is provided and an amorphous silicon layer is formed. A laser generator for generating pulse laser beams is provided. Successively moving the laser generator along a single linear path, and a plurality of strip areas of the amorphous silicon layer are in succession melted, wherein the strip areas are parallel to each other, and each two adjacent strip areas are separated by a respective interval area.

Other novel features and advantages will become more apparent from the following detailed description when taken in conjunction with the accompanying drawings.

DETAILED DESCRIPTION OF PREFERRED EMBODIMENTS

Figure 1:
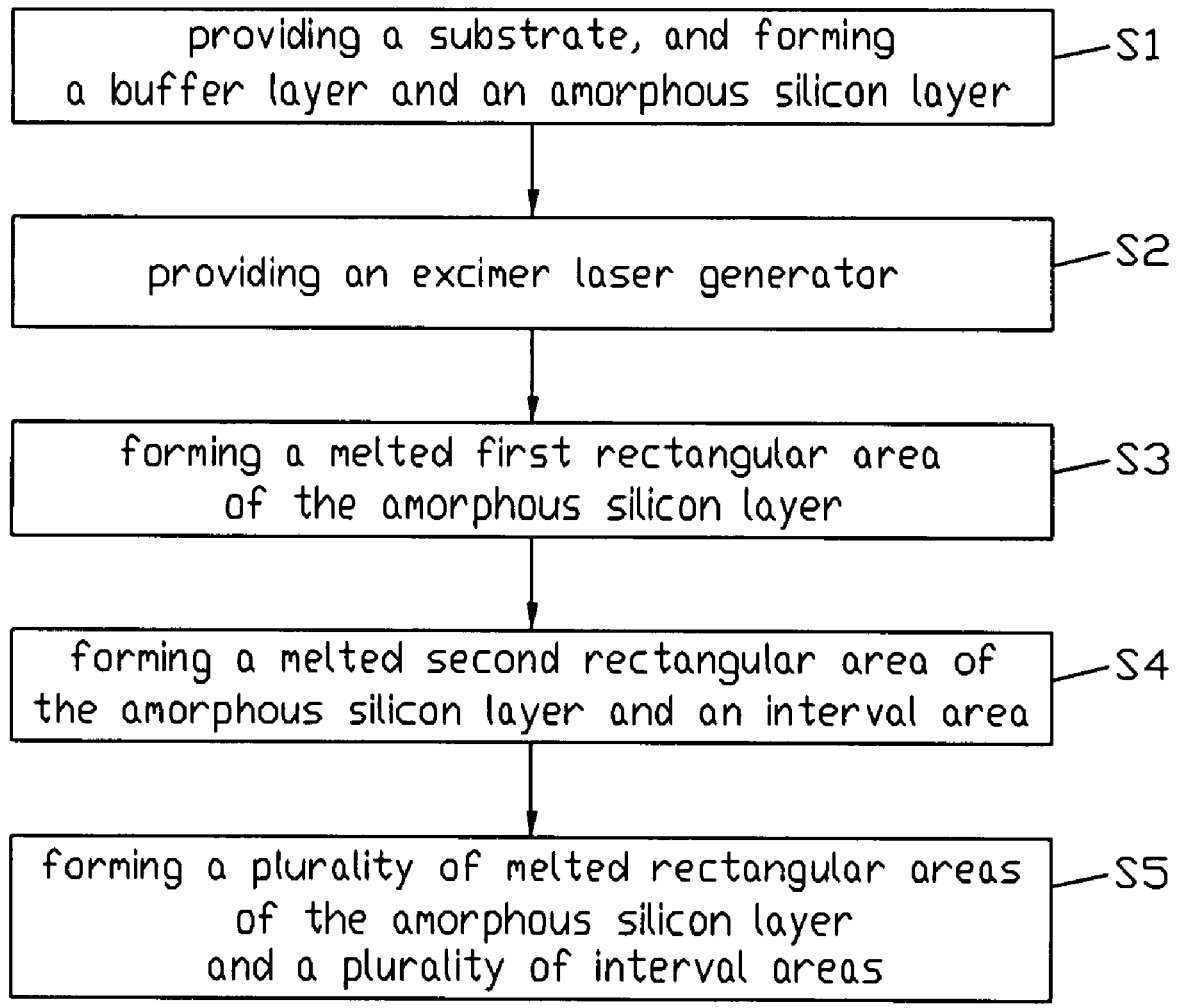
FIG. 1 is a flow chart of a method for fabricating a polysilicon layer according a preferred embodiment of the present invention.
Figure 2:
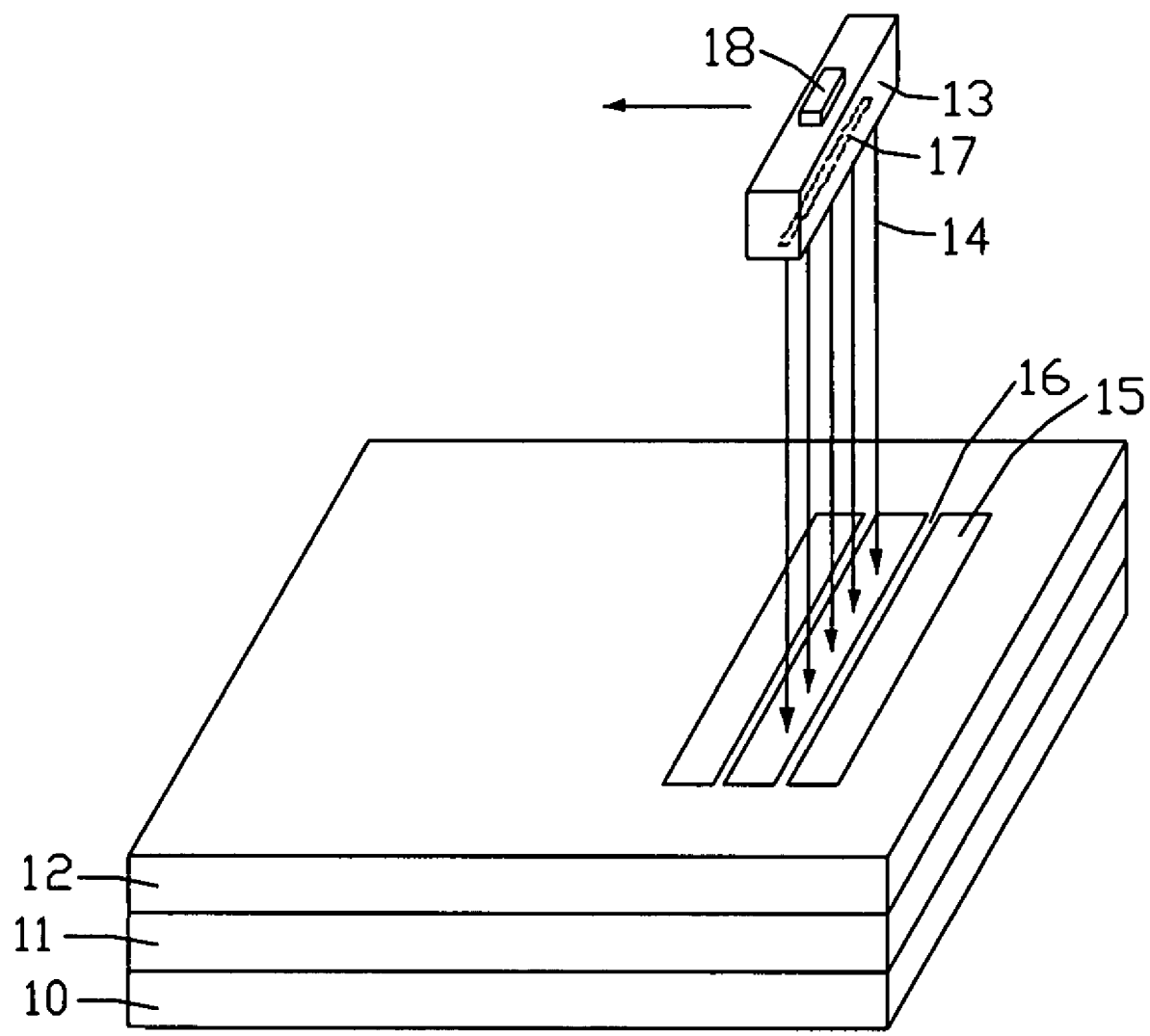
FIG. 2 is a schematic, isometric view of machinery and a substrate, showing one stage in the method of the preferred embodiment of the present invention.

FIG. 1 is a flow chart of a method for fabricating a polysilicon layer according a preferred embodiment of the present invention. The method includes 5 steps, and each step is described below with reference to FIG. 2.

In step S1, a substrate 10 is provided. Then a buffer layer 11 and an amorphous silicon layer 12 are sequentially formed on the substrate 10.

The substrate 10 can be a glass substrate. The buffer layer 11 is used for preventing impurities in the substrate 10 from diffusing into the amorphous silicon layer 12. Thereby, the quality of the polysilicon layer eventually produced can be optimized. The buffer layer 11 can be a silicon oxide layer, or a multilayer structure having a silicon nitride layer and a silicon oxide layer. The amorphous silicon layer 12 can be formed, for example, by vacuum evaporation, sputtering, low-pressure chemical vapor deposition (LPCVD), or plasma-enhanced chemical vapor deposition (PECVD).

In step S2, a laser generator such as an excimer laser generator 13 is provided. The excimer laser generator 13 has a laser emitting port 17 and a precision stepper motor 18. The laser emitting port 17 has an elongate rectangular shape, preferably with a length of 370 millimeters (mm) and a width of 0.4 micrometers (μm). Laser beams emitted from the laser emitting port 17 are pulse excimer laser beams 14, which collectively have a shape corresponding to the shape of the laser emitting port 17. The shape of the laser beams can be described as being an elongate generally rectangular shaft. The pulse excimer laser beams 14 can be generated by materials including ArF, XeCl, or XeF when such materials are in an excited state. The pulse excimer laser beams 14 generated by different materials have different wavelengths. The power and the duration of the pulse excimer laser beams 14 are variable according to a thickness of the amorphous silicon layer 12.

The excimer laser generator 13 is attached to the precision stepper motor 18. The precision stepper motor 18 is controlled by external software, to adjust a stepping time and a stepping distance of the excimer laser generator 13. The excimer laser generator 13 is stepped along a direction perpendicularly to a length of the laser emitting port 17.

In step S3, the excimer laser generator 13 generates pulse excimer laser beams 14, which vertically irradiate a first rectangular area 15 of the amorphous silicon layer 12. An amount of energy of the surface pulse excimer laser beam 14 which is supplied to the first rectangular area 15 is carefully controlled to melt the first rectangular area 15 of the amorphous silicon layer 12 completely. The surface pulse excimer laser beam 14 can be supplied to the first rectangular area 15 several times, according to the power of the excimer laser generator 13 and the thickness of the amorphous silicon layer 12.

In step S4, the precision stepper motor 18 drives the excimer laser generator 13 to step a distance along a direction perpendicular to the length of the laser emitting port 17. Then the surface pulse excimer laser beam 14 irradiates a second rectangular area 15 that is parallel to the first rectangular area 15. The stepping distance of the excimer laser generator 13 is greater than a width of the first rectangular area 15, thus an interval area 16 is formed between the first and second rectangular areas 15. A preferred width of the interval area 16 is less than ⅓ of the width of each of the rectangular areas 15. The second rectangular area 15 melts completely due to the energy of the surface pulse excimer laser beam 14, while the amorphous silicon layer 12 in the interval area 16 does not melt because it remains at a lower temperature.

In step S5, step 4 is repeated several times to form a plurality of rectangular areas 15 and a plurality of interval areas 16.

During the above ELA process, the temperatures of the rectangular areas 15 are higher than the temperatures of the interval areas 16, so a lateral temperature gradient exists from each rectangular area 15 to the adjacent interval area 16. Hence heterogeneous nucleation occurs at the interface of the rectangular area 15 and the interval area 16, thereby forming a plurality of seeds of crystallization. The seeds of crystallization grow along the direction of the lateral temperature gradient, and finally a polysilicon layer is formed.

During the above ELA process, the substrate 10 can be heated by a heating apparatus (not shown) to prolong the solidifying time of the melted amorphous silicon layer 12 and prolong the growing time of the grain seeds. This facilitates forming of a polysilicon layer having large and uniform grains. The temperature of the substrate 10 can be maintained in a range of 300° C.-400° C. The heating apparatus can be a heating furnace or a heating plate.

In the above-described method for fabricating a polysilicon layer, the laser generator 13 generates pulse excimer light beams 14 which collectively are in the shape of a generally rectangular shaft. Therefore the rectangular areas 15 of the amorphous silicon layer 12 can be melted without the need to move the excimer laser generator 13 in lateral directions. Therefore the production cycle is simplified and shortened, and the efficiency of fabrication of the polysilicon layer is improved. In addition, the lateral temperature gradient between each rectangular area 15 and the adjacent interval area 16 is larger than that of a conventional method. If the energy of the pulse excimer laser beams 14 irradiating the amorphous silicon layer 12 is under the SLG point, the grain seeds can grow larger along with the increased lateral temperature gradient. Therefore a polysilicon layer having large grain sizes is apt to be formed. Furthermore, the amount of energy applied to the amorphous silicon layer 12 can be precisely controlled by adjusting the periods of irradiation, in order to prevent the temperature of the melted amorphous silicon layer 12 from exceeding the SLG point. Moreover, a heating apparatus can be used to maintain the temperature of the substrate 10 within a predetermined range, such that the solidifying time of the melted amorphous silicon layer 12 and the growing time of the grain seeds can both be prolonged. This facilitates forming of a polysilicon film having large and uniform grains. A polysilicon layer fabricated according to the above-described method has relatively high electron mobility. The higher electron mobility improves the quality of TFTs subsequently formed from the polysilicon layer.

It is to be further understood that even though numerous characteristics and advantages of various embodiments have been set forth in the foregoing description, together with details of the related structures and functions of the embodiments, the disclosure is illustrative only, and changes may be made in detail to the full extent indicated by the broad general meaning of the terms in which the appended claims are expressed.

What is claimed is:

1. A method for fabricating a polysilicon layer, the method comprising:

providing a substrate, and forming an amorphous silicon layer over the substrate;

providing an excimer laser generator for generating pulse excimer laser beams collectively having the shape of a generally rectangular shaft, and melting a first area of the amorphous silicon layer with the pulse excimer laser beams;

moving the excimer laser generator a distance to melt a second area of the amorphous silicon layer, the second melted area spaced a short distance away from the first melted area of the amorphous silicon layer; and forming at least a subsequent third melted area spaced a short distance away from the second melted area, with each such subsequent melted area being spaced a short distance away from the immediately preceding melted area, wherein each subsequent melted area and the immediately preceding melted area are separated by an unmelted interval area.

2. The method for fabricating a polysilicon layer as claimed in claim 1, further comprising providing a stepper motor operatively connected to the excimer laser generator for driving the excimer laser generator to move.

3. The method for fabricating a polysilicon layer as claimed in claim 2, wherein every movement of the excimer laser generator is along the same linear path.

4. The method for fabricating a polysilicon layer as claimed in claim 1, wherein the excimer laser generator comprises a rectangular laser emitting port, and the pulse excimer laser beams collectively have the shape of an elongate generally rectangular shaft.

5. The method for fabricating a polysilicon layer as claimed in claim 3, wherein the elongate generally rectangular shaft of the pulse excimer laser beams has a length of approximately 370 mm as measured parallel to the laser emitting port of the excimer laser generator.

6. The method for fabricating a polysilicon layer as claimed in claim 3, wherein the elongate generally rectangular shaft of the pulse excimer laser beams has a width of approximately 0.4 µm as measured perpendicular to a length of the laser emitting port of the excimer laser generator.

7. The method for fabricating a polysilicon layer as claimed in claim 1, wherein the melted areas of the amorphous silicon layer are rectangular and are parallel to each other.

8. The method for fabricating a polysilicon layer as claimed in claim 1, wherein each of the short distances is less than 1/5 of a corresponding width of the adjacent melted area.

9. The method for fabricating a polysilicon layer as claimed in claim 1, wherein the substrate is a glass substrate.

10. The method for fabricating a polysilicon layer as claimed in claim 1, wherein the temperature of the substrate is maintained in a range of 300° C.-400° C.

11. The method for fabricating a polysilicon layer as claimed in claim 1, wherein the amorphous silicon layer is formed by a process selected from the group consisting of vacuum evaporation, sputtering, low pressure chemical vapor deposition, and plasma-enhanced chemical vapor deposition.

12. The method for fabricating a polysilicon layer as claimed in claim 1, further comprising, before forming the amorphous silicon layer, forming a buffer layer on the substrate, with the amorphous silicon layer being subsequently formed on the buffer layer.

13. The method for fabricating a polysilicon layer as claimed in claim 12, wherein the buffer layer is a silicon oxide layer.

14. The method for fabricating a polysilicon layer as claimed in claim 12, wherein the buffer layer is a multilayer having a silicon nitride layer and a silicon oxide layer.

15. A method for fabricating a polysilicon layer, the method comprising:
   providing a substrate, and forming an amorphous silicon layer on the substrate;
   providing a laser generator for generating pulse laser beams; and
   successively moving the laser generator along a single linear path and melting in succession a plurality of strip areas of the amorphous silicon layer;
   wherein the strip areas are parallel to each other, and each two adjacent strip areas are separated by a respective unmelted interval area.

16. The method for fabricating a polysilicon layer as claimed in claim 15, wherein each of the unmelted interval areas has a width of less than 1/5 of a width of each of the strip areas.

17. The method for fabricating a polysilicon layer as claimed in claim 15, wherein the laser generator is an excimer laser generator, and the strip areas are melted by pulse excimer laser beams.

* * * * *